US012696412B2

(12) United States Patent
Tai

(10) Patent No.: US 12,696,412 B2
(45) Date of Patent: Jul. 28, 2026

(54) FIXING DEVICE FOR POWER CONNECTOR

(71) Applicant: ACCTON TECHNOLOGY CORPORATION, Hsinchu (TW)

(72) Inventor: Hung-Feng Tai, Taoyuan City (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 107 days.

(21) Appl. No.: 18/954,534

(22) Filed: Nov. 21, 2024

(65) Prior Publication Data

US 2025/0324534 A1 Oct. 16, 2025

(51) Int. Cl.
*H05K 7/14* (2006.01)

(52) U.S. Cl.
CPC .................................. *H05K 7/1452* (2013.01)

(58) Field of Classification Search
CPC .... H05K 5/069; H05K 7/1481; H05K 7/1452; H05K 7/1454; H01R 13/74; H01R 13/73
See application file for complete search history.

(56) References Cited

U.S. PATENT DOCUMENTS 6,033,247 A * 3/2000 Gregory, II ........ H01R 13/6315
439/247
6,347,955 B1 * 2/2002 Huang ................. H01R 13/629
439/378

6,890,200 B1 * 5/2005 Wu ..................... H01R 13/6315
439/573
2009/0197438 A1 * 8/2009 Liu ...................... H01R 13/506
439/76.1
2013/0163261 A1 * 6/2013 Shimoji ................ H01R 13/74
362/382
2015/0333446 A1 * 11/2015 Yuan ................... H01R 13/665
439/248
2018/0109027 A1 * 4/2018 Kaneko ................. H05K 5/069

* cited by examiner

*Primary Examiner* — Sagar Shrestha
(74) *Attorney, Agent, or Firm* — Apex Juris, pllc; R. Lynette Wylie

(57) ABSTRACT

A fixing device is for connecting to a power connector which has a main body and two ear portions located on opposite sides of the main body and respectively having an engaging hole. The fixing device includes a main plate, a positioning assembly, and two fixing members passing through first through holes to engage with the engaging holes. The main plate has a slot for being inserted by the power connector. The slot includes a main section and two side sections communicating with the main section and located on opposite sides of the main section. Each side section has a positioning edge portion. The positioning assembly includes two positioning plates which respectively include a plate body, a tongue connected to the plate body, and a fitting portion formed between the tongue and the plate body and fitted to the positioning edge portion. The main body passes between the plate bodies.

10 Claims, 18 Drawing Sheets

200

10

30

20a

L3

L2

L1

FIXING DEVICE FOR POWER CONNECTOR

BACKGROUND OF THE INVENTION

Technical Field

The present disclosure relates generally to a power connector of an electronic apparatus, and more particularly to a fixing device for a power connector.

Description of Related Art

In the Big Data Era, more and more industries perform data processing through data centers, wherein servers are used for massive data computing and data storage. In order to meet the demand of the rapid increase of the data amount, the server technology has been rapidly developed. Open Compute Project (OCP) is proposed to accelerate the development of the data center. By sharing the software and hardware design of the individual data center and formulating the standardization and specification of the technology, Open Compute Project provides a technology exchange platform for improving the performance of the servers and reducing the power consumption of the servers, thereby improving the efficiency of the data center.

The increasing demand of the servers leads to different problems, including the maintenance of the hardware and the accommodating space required. Open Rack Standards have been developed. With Open Rack Standards, the standard of the connections among the hardware of the servers of the data centers is unified, thereby reducing the operation complexity of integrating a large number of servers and greatly reducing the size of the servers.

Open Rack Standards have different power versions. The sizes of the power connectors in each power version are different. As a result, the structures and the sizes of the holes of the casing of the electronic apparatus for installing the power connectors are different. For example, the power connector in the 12 V power version could not be installed on the casing of the electronic apparatus in the 48 V power version and vice versa. Hence, it is required to re-design a new version of casing for different power connectors in different power versions, which increases the development cost of the casing.

BRIEF SUMMARY OF THE INVENTION

In view of the above, the primary objective of the present disclosure is to provide a fixing device, which could allow a power connector with a small size to be installed on a main plate.

The present disclosure provides a fixing device adapted to connect to a power connector, wherein the power connector has a main body and two ear portions. The two ear portions are located on two opposite sides of the main body and respectively have an engaging hole. The fixing device includes a main plate, a positioning assembly, and two fixing members. The main plate has a slot. The slot is adapted to be inserted by the power connector. The slot includes a main section and two side sections. The two side sections are respectively located on two opposite sides of the main section. A periphery of each of the two side sections has at least one positioning edge portion. The positioning assembly includes two positioning plates. Each of the two positioning plates includes a plate body and at least one tongue. The at least one tongue is connected to the plate body. At least one fitting portion is formed between the at least one tongue and the plate body. The at least one tongue of each of the two positioning plates corresponds to each of the two side sections of the slot. The at least one fitting portion of each of the two positioning plates fits around the at least one positioning edge portion of the periphery of each of the two side sections. The main body of the power connector passes between the two plate bodies of the two positioning plates. Each of the two plate bodies has a first through hole. The two first through holes of the two plate bodies respectively correspond to the two engaging holes of the two ear portions of the power connector. The two fixing members respectively pass through the two first through holes of the two plate bodies to engage with the two engaging holes of the two ear portions of the power connector.

With the aforementioned design, the positioning plates of the positioning assembly restrict the size of the slot of the main plate and the fitting portions of the tongues are fitted to the positioning edge portions of the main plate, so that the space formed between the two plate bodies restricts the size of the slot in the horizontal axis. In this way, the fixing device could allow the power connector with a smaller size to pass through the space. Moreover, when another power connector with a larger size is about to be installed, the positioning assembly could be omitted and the main body of the another power connector could directly pass through the main section along the reference axis, and the two fixing members fix the another power connector, so that the another power connector with a larger size could be installed without changing the main plate.

BRIEF DESCRIPTION OF THE SEVERAL VIEWS OF THE DRAWINGS

The present disclosure will be best understood by referring to the following detailed description of some illustrative embodiments in conjunction with the accompanying drawings, in which.

DETAILED DESCRIPTION OF THE INVENTION

Figure 1:
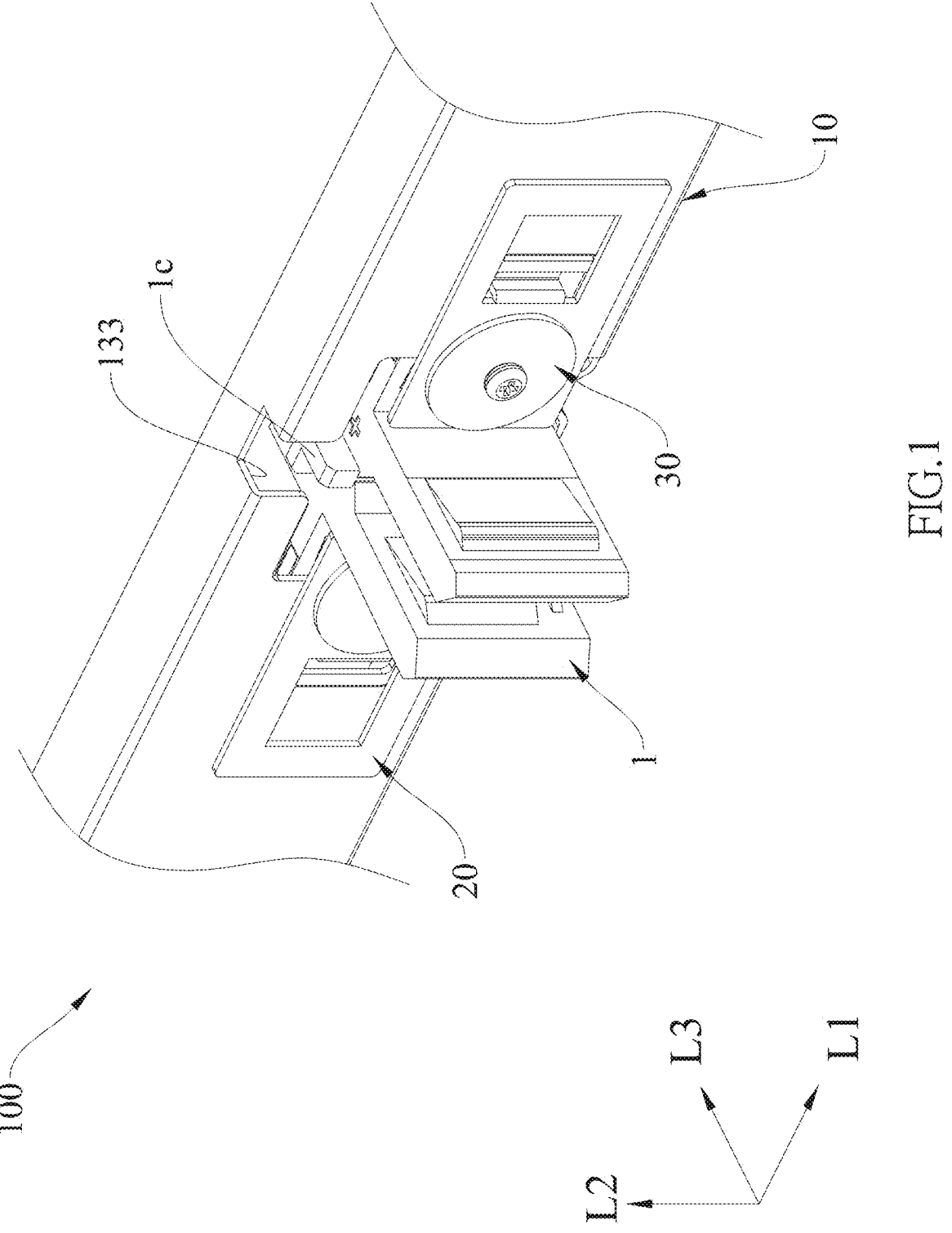
FIG. 1 is a perspective view of the fixing device according to a first embodiment of the present disclosure.

A fixing device 100 according to a first embodiment of the present disclosure is illustrated in FIG. 1 to FIG. 8 and is adapted to connect to a power connector 1. In the current embodiment, a specification of the power connector 1 meets the 48 V power version of Open Rack Standards as an example. In order to illustrate easily, a horizontal axis L1, a vertical axis L2, and a reference axis L3 which are perpendicular to one another are defined. The power connector 1 has a main body 1a, two ear portions 1b, and a stop portion 1c. The two ear portions 1b are respectively located on two opposite sides of the main body 1a in the horizontal axis L1. Each of the ear portions 1b has an engaging hole 1b1. The stop portion 1c is located on a top surface of the main body 1a. The fixing device 100 includes a main plate 10, a positioning assembly 20, and two fixing members 30.

Figure 2:
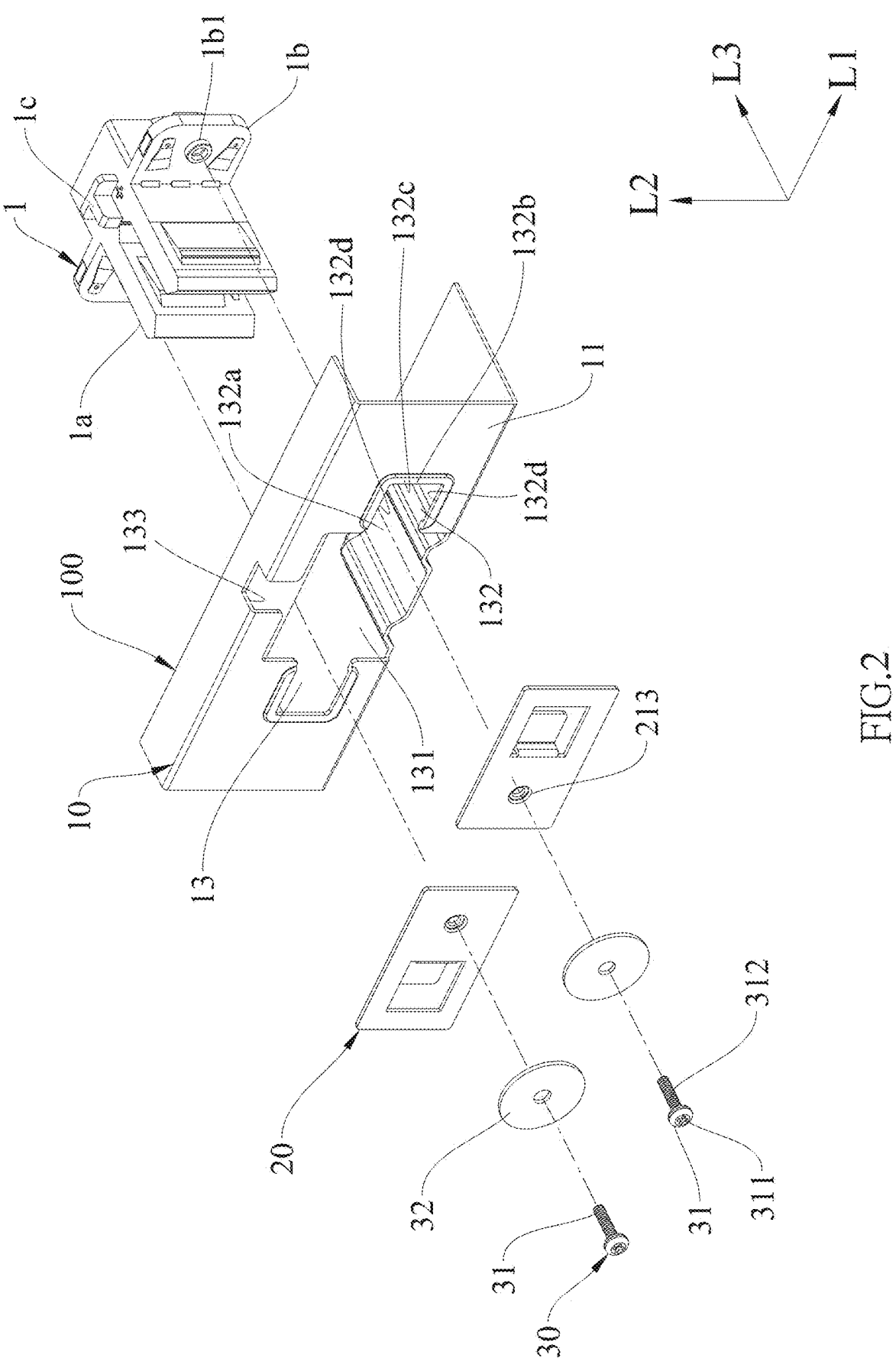
FIG. 2 is an exploded view of the fixing device in FIG. 1.
Figure 3:
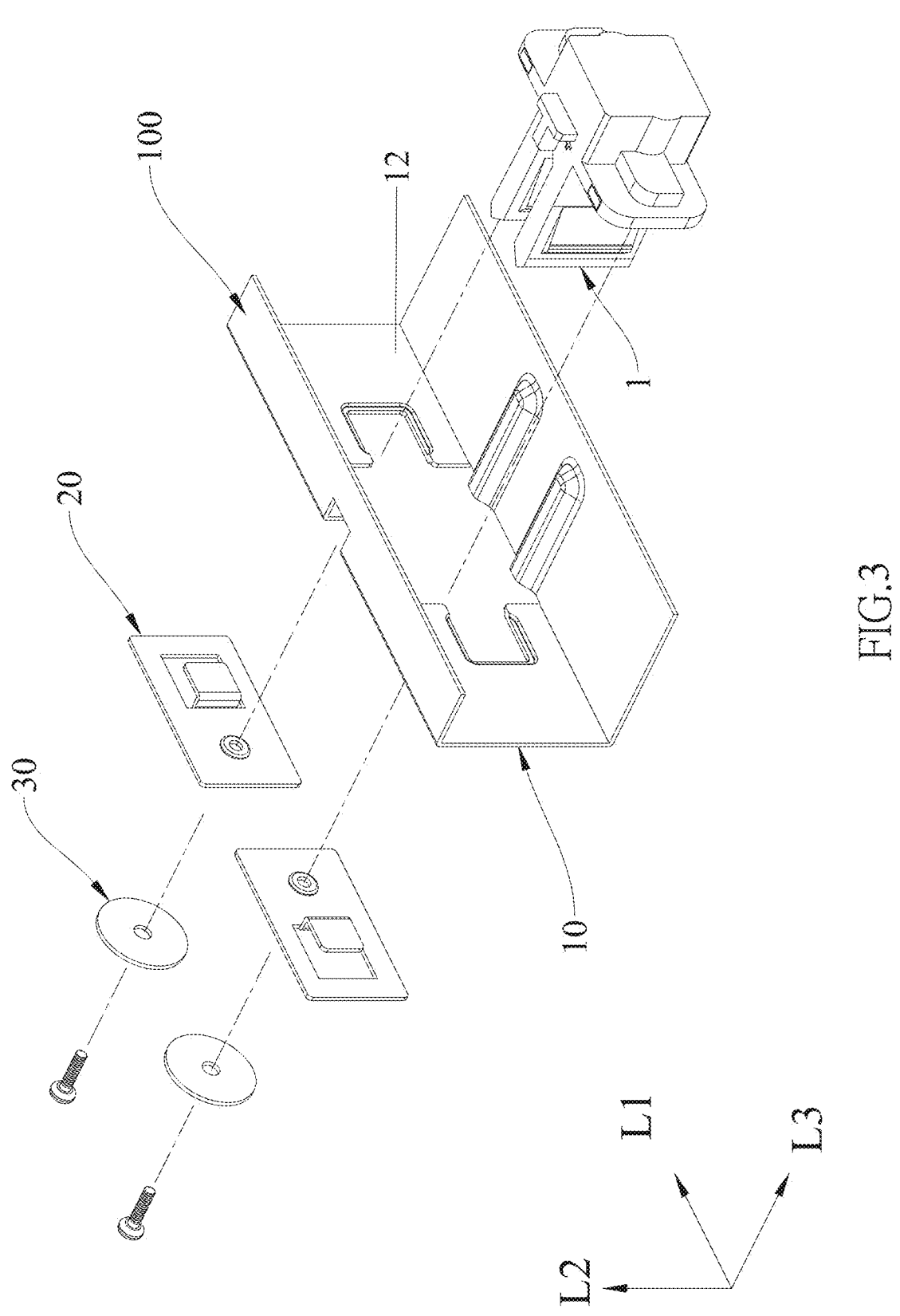
FIG. 3 is an exploded view of the fixing device in FIG. 1 seen from another perspective.

Referring to FIG. 2 and FIG. 3, the main plate 10 has an outer surface 11, an inner surface 12, and a slot 13. The slot 13 penetrates through the outer surface 11 and the inner surface 12 along the reference axis L3. The slot 13 is adapted to receive the power connector 1, which is inserted in a direction toward the inner surface 12 along the reference axis L3. The slot 13 includes a main section 131, two side sections 132, and a notch 133 that communicate with one another. The two side sections 132 are respectively located on two opposite sides of the main section 131 in the horizontal axis L1. Each of the side sections 132 has an open end 132a and a closed end 132b, wherein the open end 132a communicates with the main section 131. A periphery of each of the side sections 132 has at least one positioning edge portion 132c and two connected walls 132d. The notch 133 is located on a side of the main section 131 in the vertical axis L2 and communicates with the main section 131. In the current embodiment, the at least one positioning edge portion 132c of each of the side sections 132 includes one positioning edge portion 132c; the two positioning edge portions 132c of the two side sections 132 are disposed on the two closed end 132b and face each other along the horizontal axis L1; the two connected walls 132d of each of the side sections 132 are located on a periphery of each of the side sections 132 in the vertical axis L2 and correspond to each other along the vertical axis L2. In the current embodiment, the main plate 10 is a rear plate of a casing of an electronic apparatus.

Figure 4:
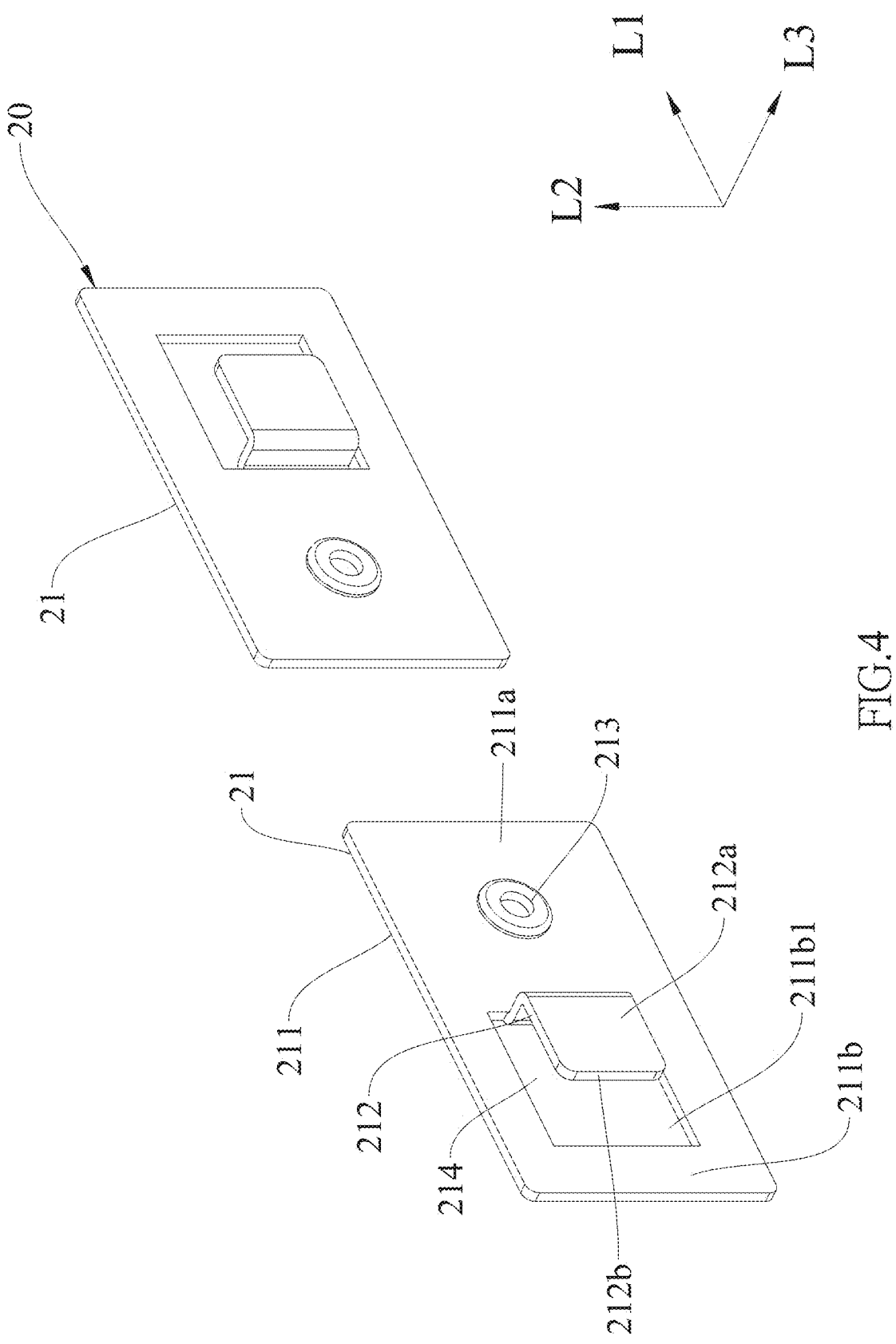
FIG. 4 is a schematic view of the positioning assembly in FIG. 1.
Figure 6:
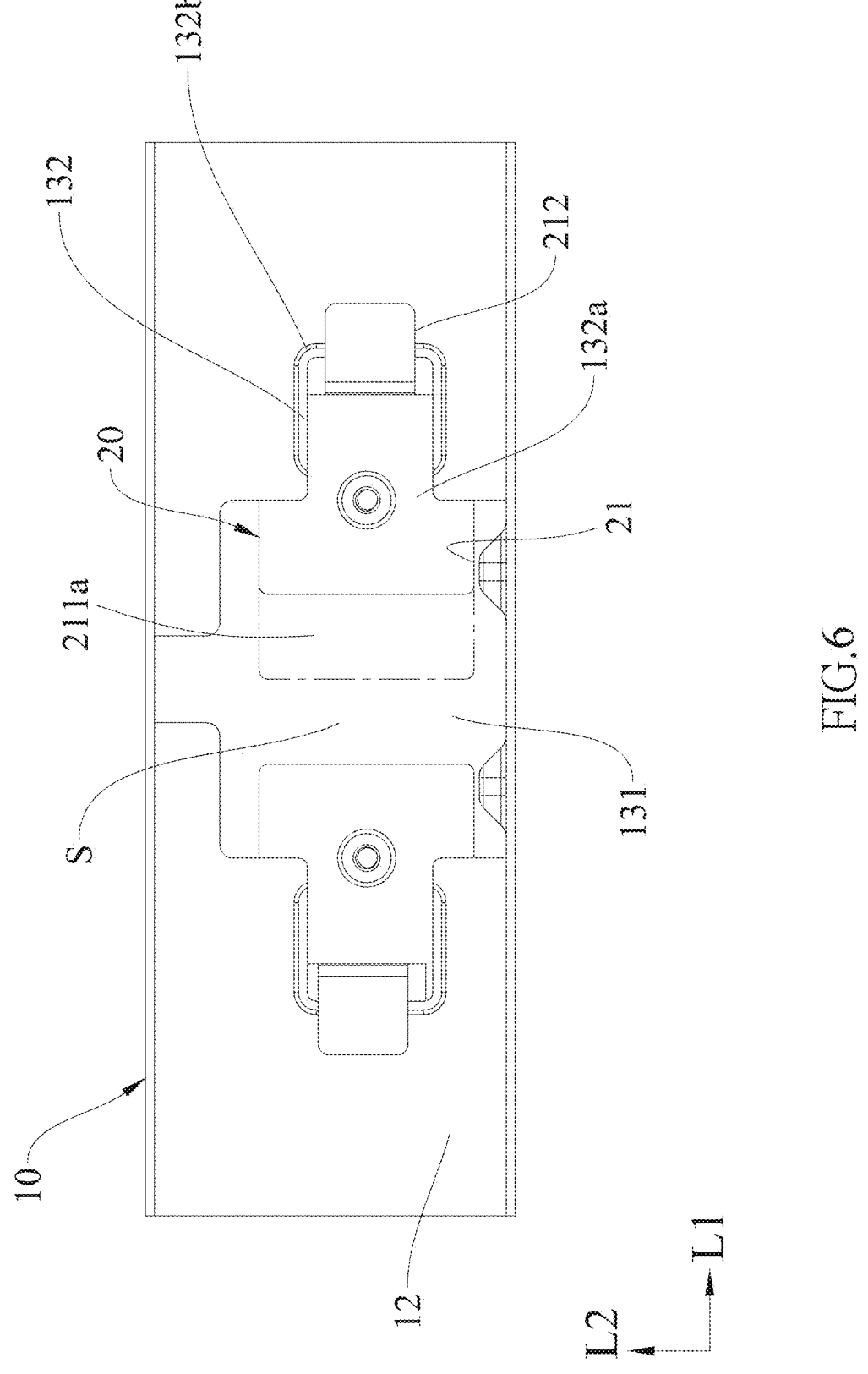
FIG. 6 is a schematic view of the positioning assembly in FIG. 1 installed on the main plate.

Referring to FIG. 4 and FIG. 6, the positioning assembly 20 includes two positioning plates 21. Each of the positioning plates 21 includes a plate body 211, at least one tongue 212, and a first through hole 213. The plate body 211 of each of the positioning plates 21 has a first section 211a and a second section 211b. A space S is formed between the two first sections 211a of the two positioning plates 21. The space S is adapted to be passed through by the main body 1a of the power connector 1 along the reference axis L3. The first through hole 213 of each of the positioning plates 21 is located on the first section 211a and corresponds to each of the side sections 132. The second section 211b has at least one second through hole 211b1 corresponding to the outer surface 11 of the main plate 10 (referring to FIG. 2). In the current embodiment, the at least one second through hole 211b1 of each of the positioning plates 21 includes one second through hole 211b1; the at least one tongue 212 of each of the positioning plates 21 includes one tongue 212; the tongue 212 is formed by die cutting as an example. Each of the tongues 212 includes a bent portion 212a and a free end 212b. A side of the bent portion 212a of each of the tongues 212 is connected to a hole edge of each of the second through holes 211b1 and extends along the reference axis L3. Another side of the bent portion 212a of each of the tongues 212 is bent toward the horizontal axis L1 to form the free end 212b. A fitting portion 214 is formed between each of the tongues 212 and each of the plate bodies 211. The fitting portion 214 of each of the positioning plates 21 is movably fitted to the positioning edge portion 132c of the periphery of each of the side sections 132 along the horizontal axis L1. The two free ends 212b of the two tongues 212 face back to back in the horizontal axis L1. In other words, the two fitting portions 214 of the two positioning plates 21 face back to back in the horizontal axis L1. The tongue 212 of each of the positioning plates 21 corresponds to each of the side sections 132 of the slot 13 and faces the inner surface 12 of the main plate 10. In this way, the positioning assembly 20 restricts the slot 13 to correspond to the space S formed between the two first sections 211a, so that the slot 13 could fit the specification of the power connector 1 for being inserted by the power connector 1. The two fitting portions 214 are movably fitted to the two positioning edge portions 132c, so that the slot 13 could be adjusted in terms of position to match a tolerance of the specification of the power connector 1 for being passed through by the power connector 1.

Figure 5:
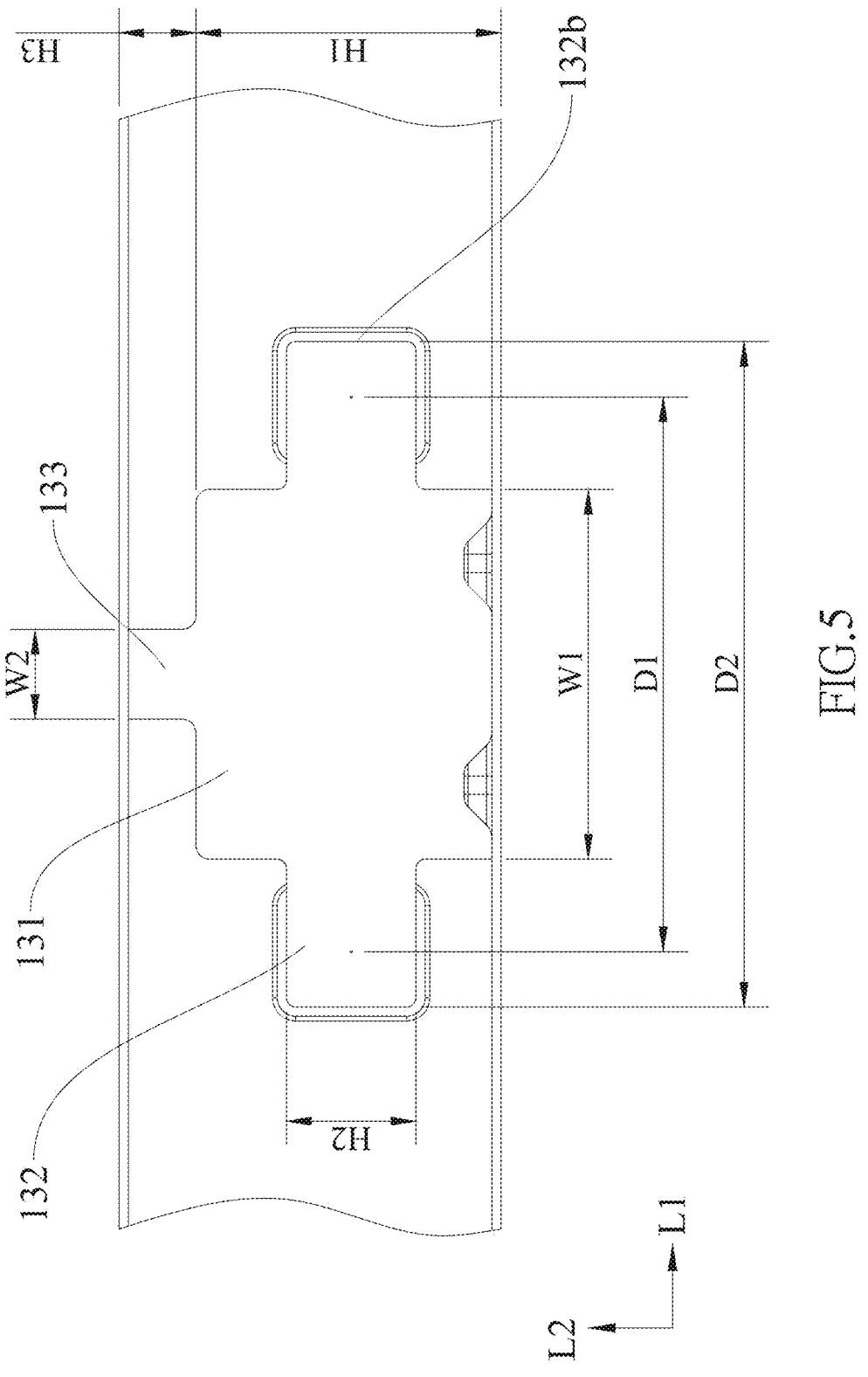
FIG. 5 is a schematic view of the main plate in FIG. 1.

Referring to FIG. 5, a height H1 of the main section 131 in the vertical axis L2 ranges between 31.8 mm and 32.2 mm. A width W1 of the main section 131 in the horizontal axis L1 ranges between 39.8 mm and 40.2 mm. A height H2 of each of the two side sections 132 in the vertical axis L2 ranges between 12.9 mm and 14.1 mm. A distance D1 between two centers of the two side sections 132 in the horizontal axis L1 ranges between 59.8 mm and 60.2 mm. A distance D2 between the two closed ends 132b of the two side sections 132 in the horizontal axis L1 ranges between 71.7 mm and 72.3 mm. A width W2 of the notch 133 in the horizontal axis L1 ranges between 9.5 mm and 9.9 mm. A height H3 of the notch 133 in the vertical axis L2 ranges between 7.95 mm and 8.45 mm.

Referring to FIG. 2, the two fixing members 30 are respectively engaged with the two engaging holes 1b1 of the two ear portions 1b of the power connector 1. Each of the fixing members 30 includes a bolt 31 and a gasket 32. The bolt 31 includes a head portion 311 and a body portion 312. In operation, each of the body portions 312 passes through each of the gaskets 32, each of the first through holes 213, each of the side sections 132, and each of the engaging holes 1b1 in sequence along the reference axis L3. Each of the gaskets 32 is located between each of the head portions 311 and the plate body 211 of each of the corresponding positioning plates 21 to prevent each of the bolts 31 from being loosened easily. In this way, the power connector 1 and the positioning assembly 20 are connected by screwing with the two fixing members 30.

Figure 7:
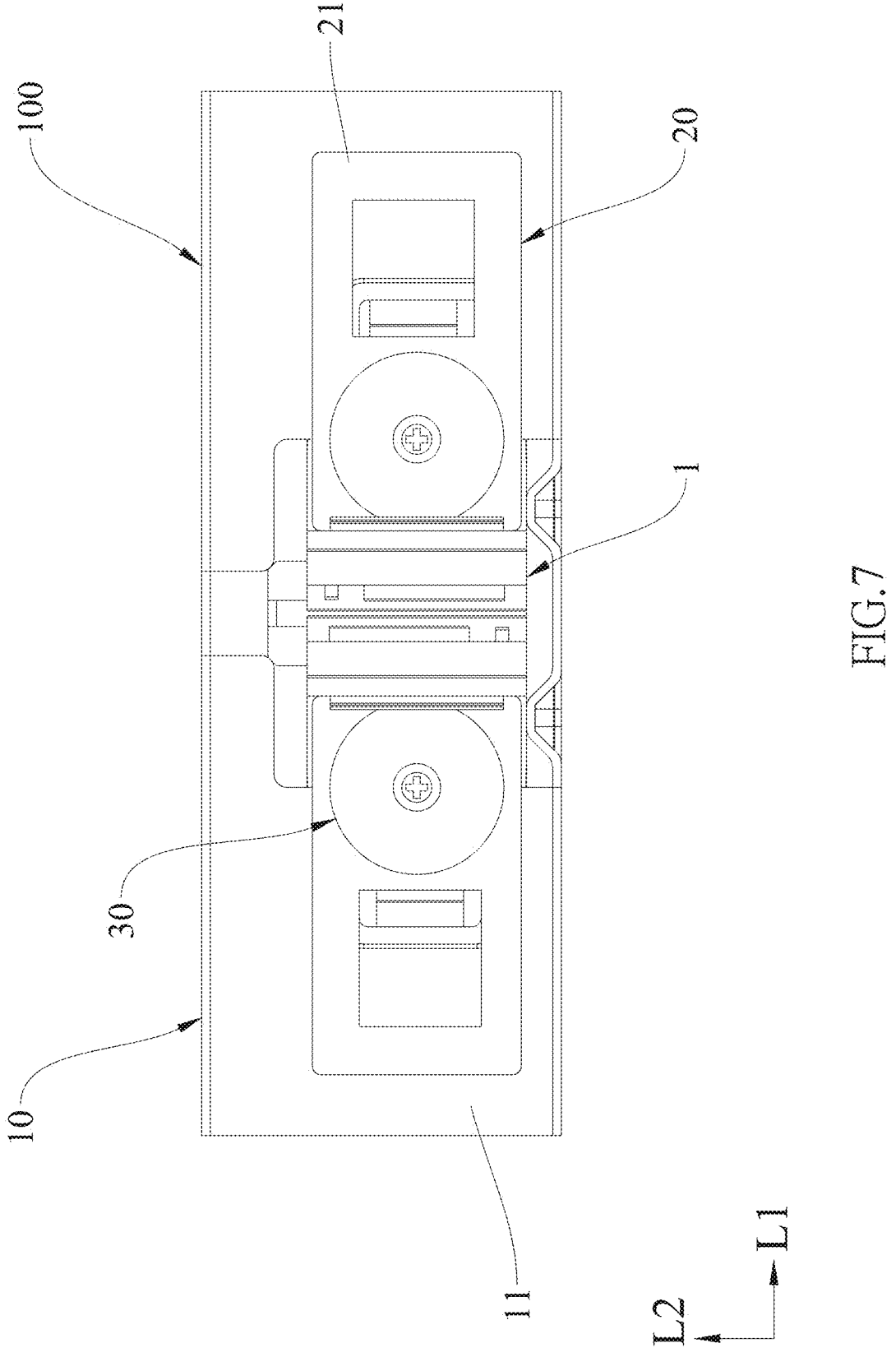
FIG. 7 is a front view of the fixing device in FIG. 1.
Figure 8:
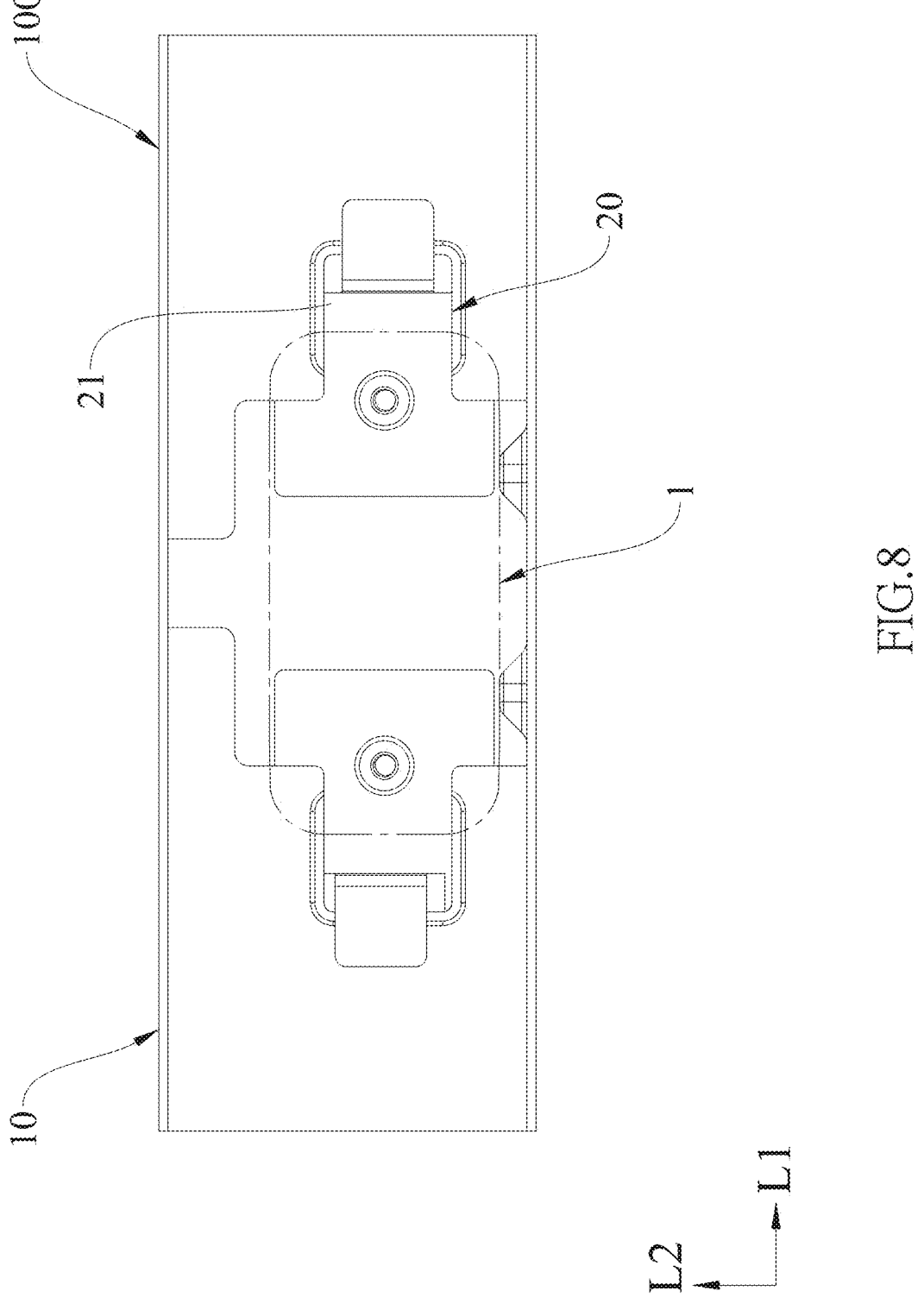
FIG. 8 is a rear view of the fixing device in FIG. 1.

Referring to FIG. 6 to FIG. 8, the two tongues 212 of the two positioning plates 21 of the positioning assembly 20 pass through the slot 13. The positioning plates 21 are respectively moved from the corresponding main section 131 of the slot 13 to the side sections 132 along the horizontal axis L1, so that each of the tongues 212 is moved from the main section 131 to pass through the open end 132a of each of the side sections 132 and is moved toward the closed end 132b of each of the side sections 132 along the horizontal axis L1 until the fitting portion 214 of each of the positioning plates 21 fits around the positioning edge portion 132c of each of the side sections 132 along the horizontal axis L1 (referring to FIG. 4). Then, the power connector 1 is moved toward the inner surface 12 of the main plate 10 along the reference axis L3, so that the main body 1a of the power connector 1 passes through the main section 131 and the space S between the two first sections 211a along the reference axis L3 and protrudes out of the outer surface 11 of the main plate 10. The two fixing members 30 are screwed with the two first through holes 213 of the positioning assembly 20 and the two engaging holes 1b1 of the power connector 1 in sequence along the reference axis L3 (referring to FIG. 2). By restricting a size of the slot 13 through the positioning assembly 20, the space S between the two first sections 211a could match the specification of the power connector 1 for inserting the power connector 1 into the slot 13. Moreover, the two fixing members 30 are screwed with the positioning assembly 20 and the power connector 1, so that the power connector 1 is installed on the main plate 10 without being easily detached and the power connector 1 is slightly movable towards top, bottom, left, and right relative to the main plate 10. Additionally, the stop portion 1c of the power connector 1 passes through the notch 133 to restrict a movement of the power connector 1 along the horizontal axis L1.

Figure 9:
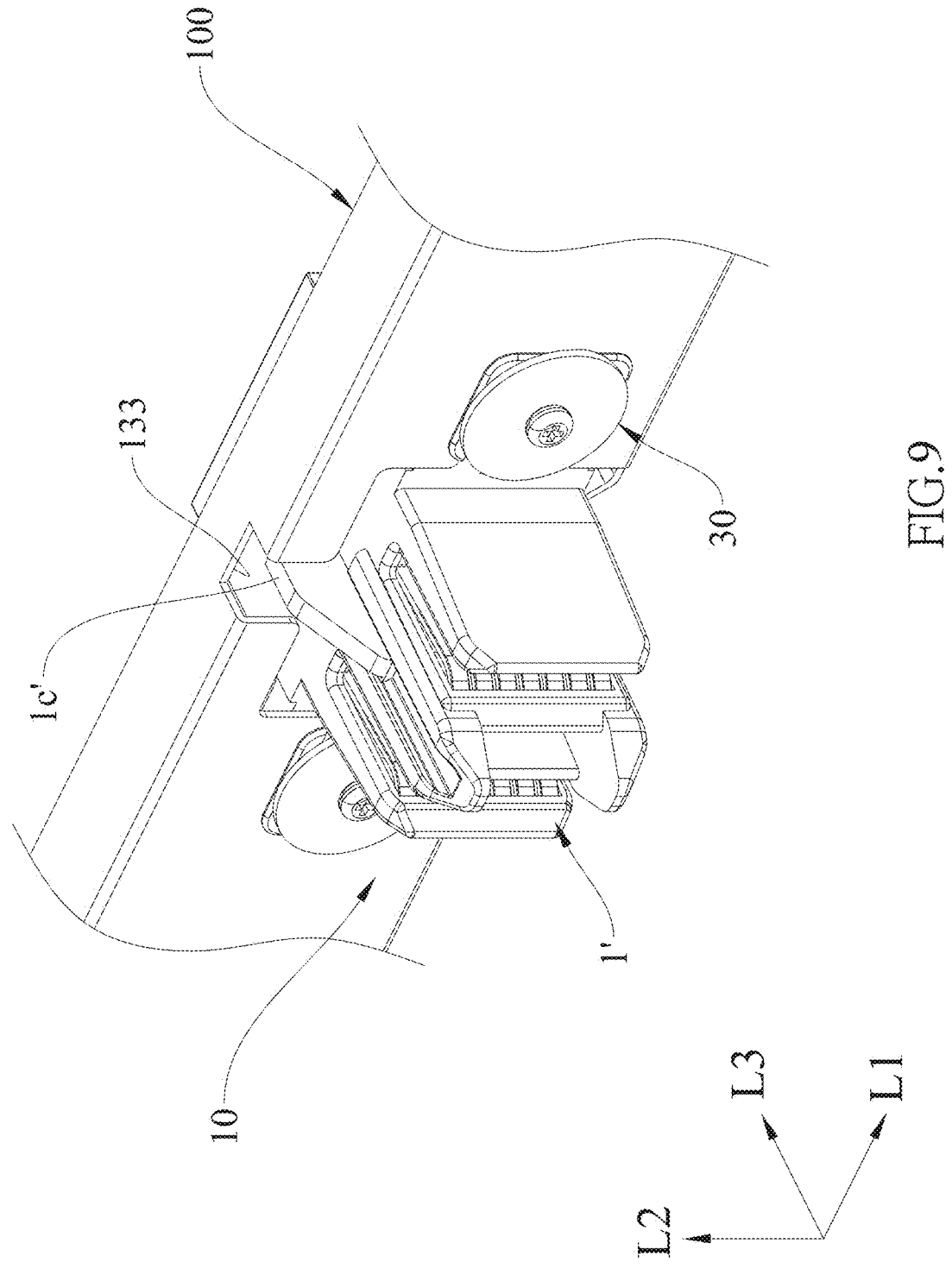
FIG. 9 is a perspective view of the fixing device according to another embodiment of the present disclosure.
Figure 10:
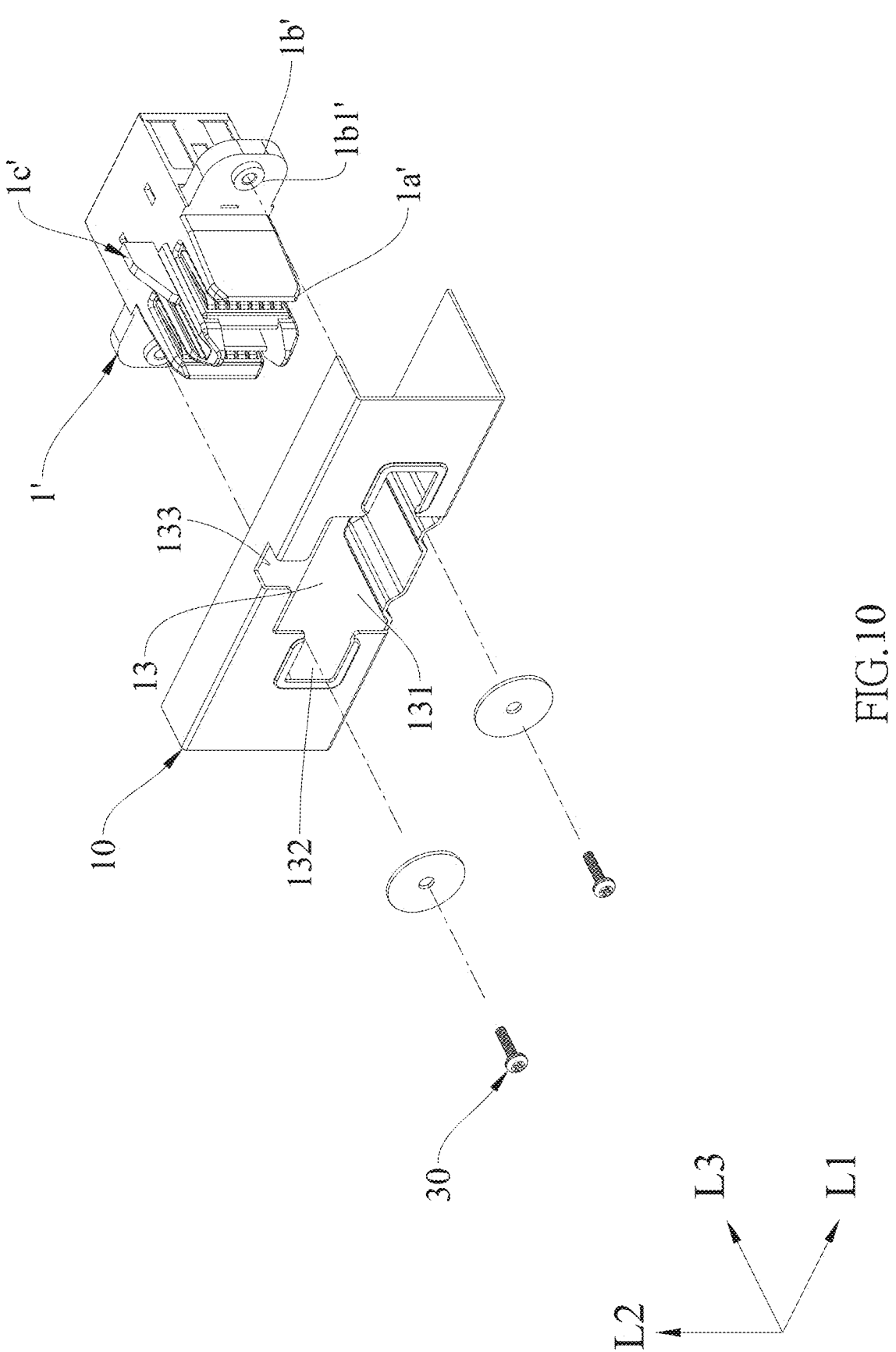
FIG. 10 is an exploded view of the fixing device in FIG. 9.
Figure 11:
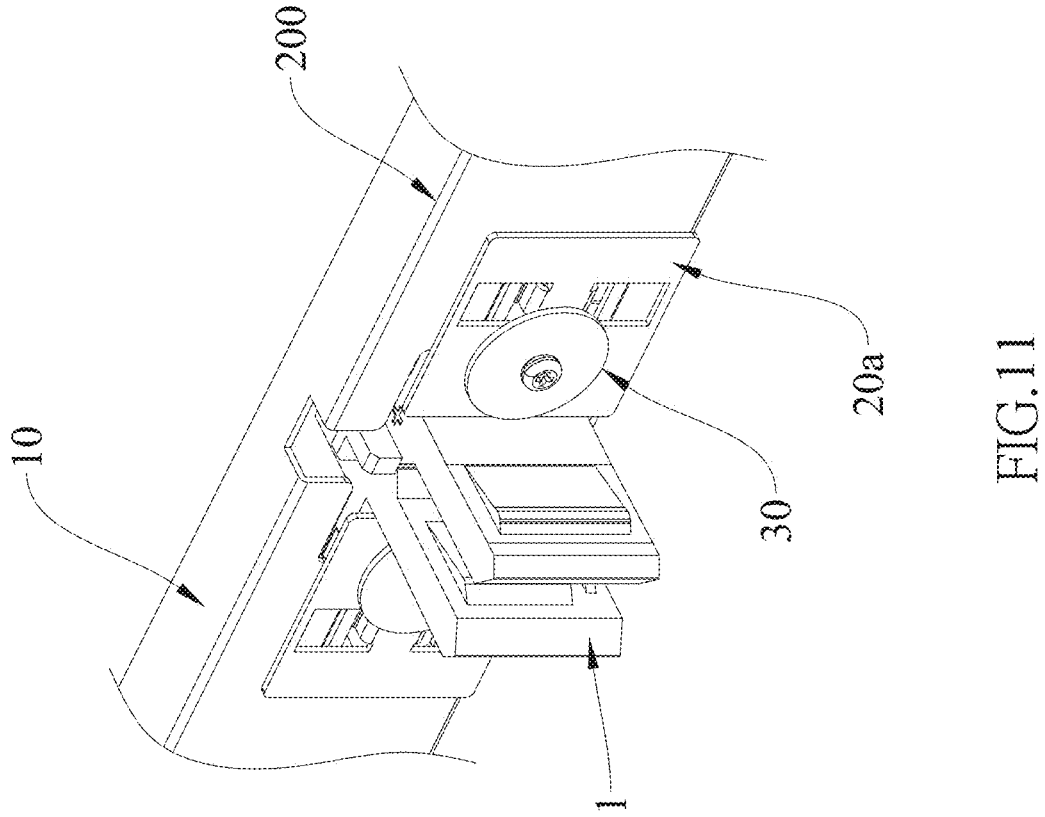
FIG. 11 is a perspective view of the fixing device according to a second embodiment of the present disclosure.
Figure 11:
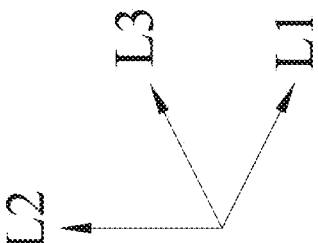

Referring to FIG. 9 to FIG. 10, in other embodiments, the positioning assembly 20 could be omitted for meeting a specification of another power connector 1'. For example, when the another power connector 1' with a larger size is used, a specification of the another power connector 1' could meet the 12 V power version of Open Rack Standards. A distance between two engaging holes 1b1' of two ear portions 1b' of the another power connector 1' is greater. The positioning assembly 20 could be omitted and a main body 1a' of the another power connector 1' passes through the main section 131 along the reference axis L3. At that time, the two ear portions 1b' of the another power connector 1' correspond to the two side sections 132, and the two fixing members 30 pass through the two side sections 132 along the reference axis L3 to be screwed with the two engaging holes 1b1' of the power connector 1'. Moreover, a stop portion 1c' of the another power connector 1' passes through the notch 133 to restrict a movement of the another power connector 1' along the horizontal axis L1.

With the positioning assembly 20, the power connector 1 with a smaller size could be installed on the main plate 10, and the slot 13 of the main plate 10 could be applicable to the two power connectors 1,1' with two different sizes, i.e., applicable to the power connectors in 12 V power version and 48 V power version of Open Rack Standards.

Figure 12:
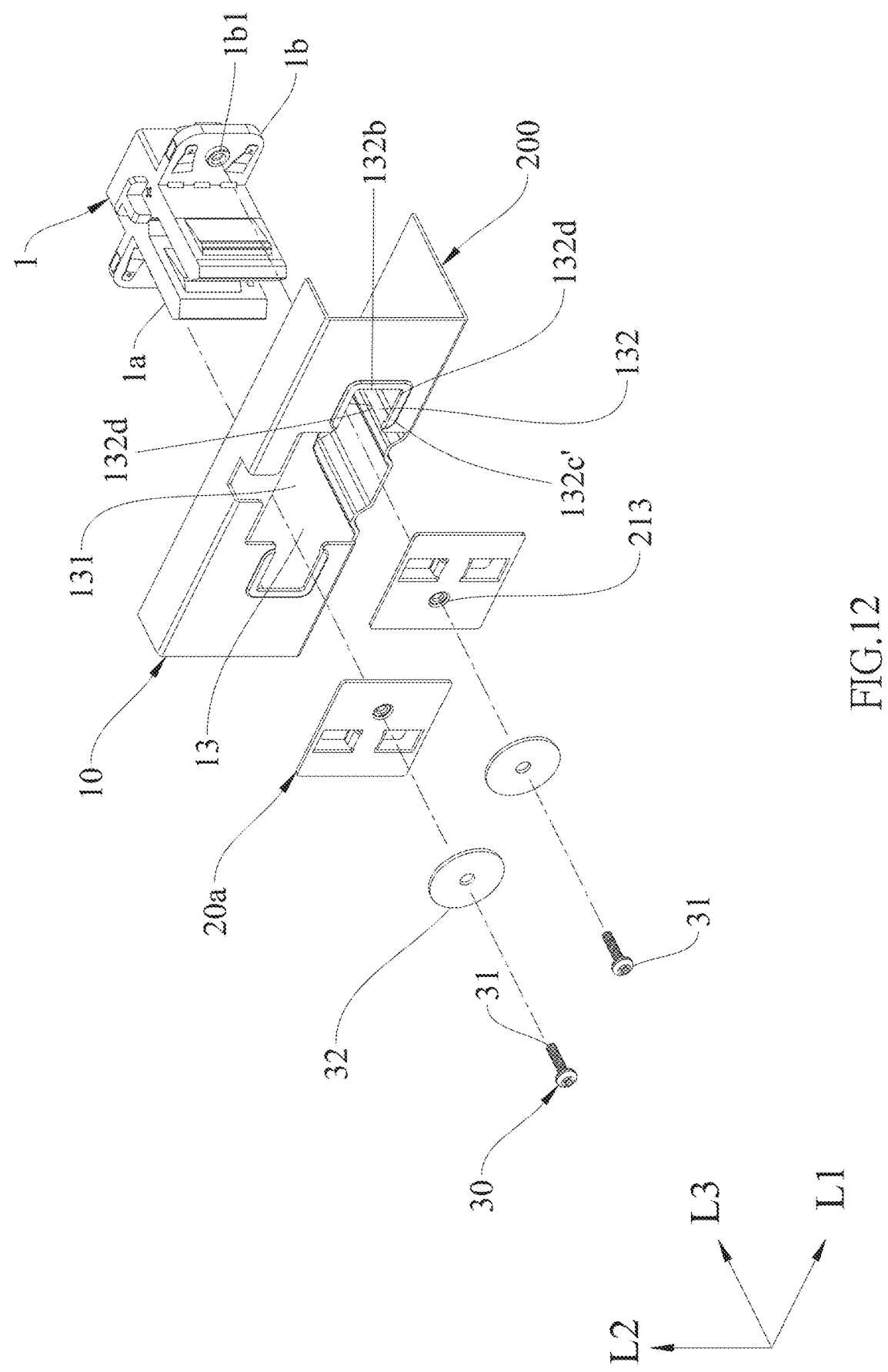
FIG. 12 is an exploded view of the fixing device in FIG. 11.
Figure 13:
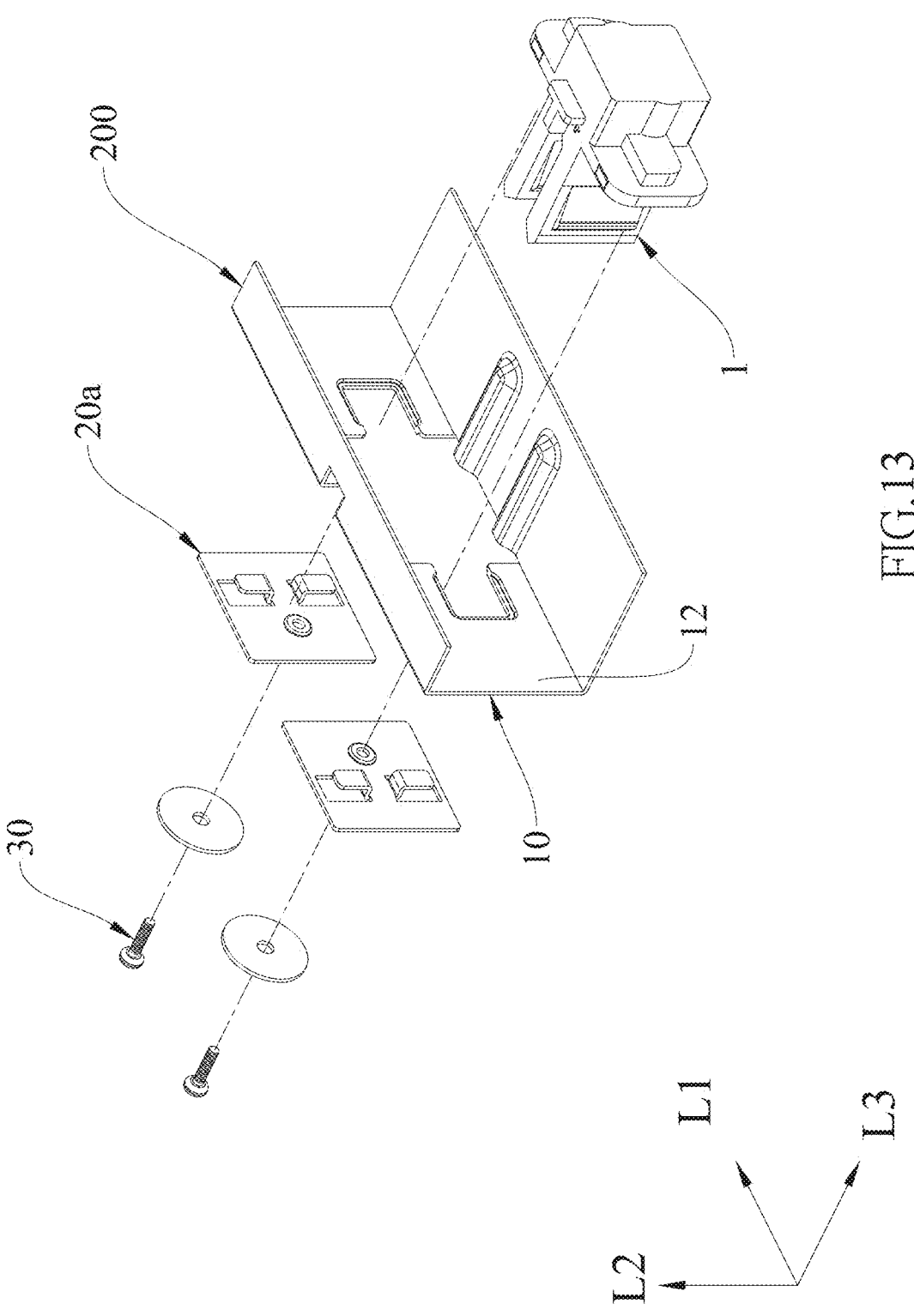
FIG. 13 is an exploded view of the fixing device in FIG. 11 seem from another perspective.
Figure 14:
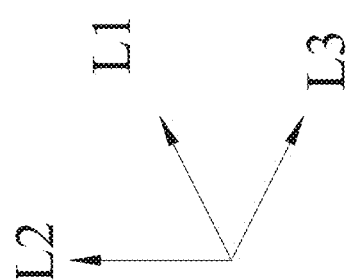
FIG. 14 is a schematic view of the positioning assembly in FIG. 11.
Figure 14:
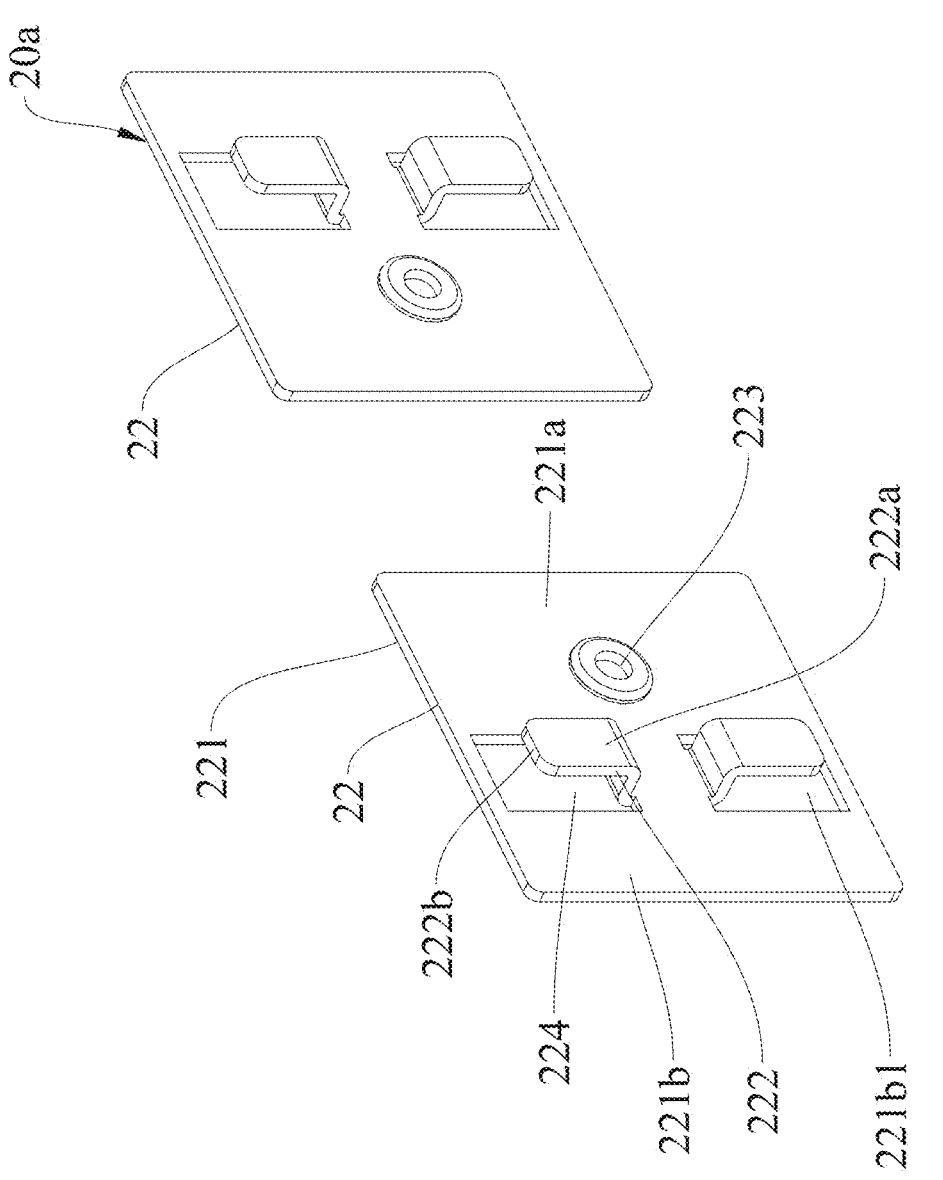

A fixing device 200 according to a second embodiment of the present disclosure is illustrated in FIG. 11 to FIG. 17 and has almost the same structure as that of the first embodiment, except that referring to FIG. 12 and FIG. 13, in the second embodiment, the at least one positioning edge portion 132c' of each of the side sections 132 of the main plate 10 includes two positioning edge portions 132' and the two positioning edge portions 132' are respectively formed on a periphery of the two connected walls 132d in the vertical axis L2 and correspond to each other along the vertical axis L2.

Moreover, in the second embodiment, a positioning assembly 20a includes two positioning plates 22 which are different from the positioning plates 21 of the first embodiment. More specifically, referring to FIG. 14 and FIG. 15, at least one second through hole 221b1 of two second sections 221b of each of the positioning plates 22 includes two second through holes 221b1. At least one tongue 222 of each of the positioning plates 22 includes two tongues 222. The two second through holes 221b1 of each of the second sections 221b are opposite to each other in the vertical axis L2. Each of the tongues 222 of each of the positioning plates 22 includes a bent portion 222a and a free end 222b. A side of the bent portion 222a of each of the tongues 222 is connected to a hole edge of each of the second through holes 221b1 and extends along the vertical axis L2. Another side of the bent portion 222a of each of the tongues 222 is bent toward the vertical axis L2 to form the free end 222b. The two free end 222b of the two tongues 222 of each of the positioning plates 22 face back to back in the vertical axis L2. At least one fitting portion 224 is formed between each of the tongues 222 and each of the plate bodies 221. In the current embodiment, the number of the at least one fitting portion 224 of each of the positioning plates 22 corresponds to the number of the tongues 222 of each of the positioning plates 22 to be two; the fitting portions 224 of each of the positioning plates 22 is movably fitted to the positioning edge portions 132c' around each of the side sections 132 along the vertical axis L2.

Figure 15:
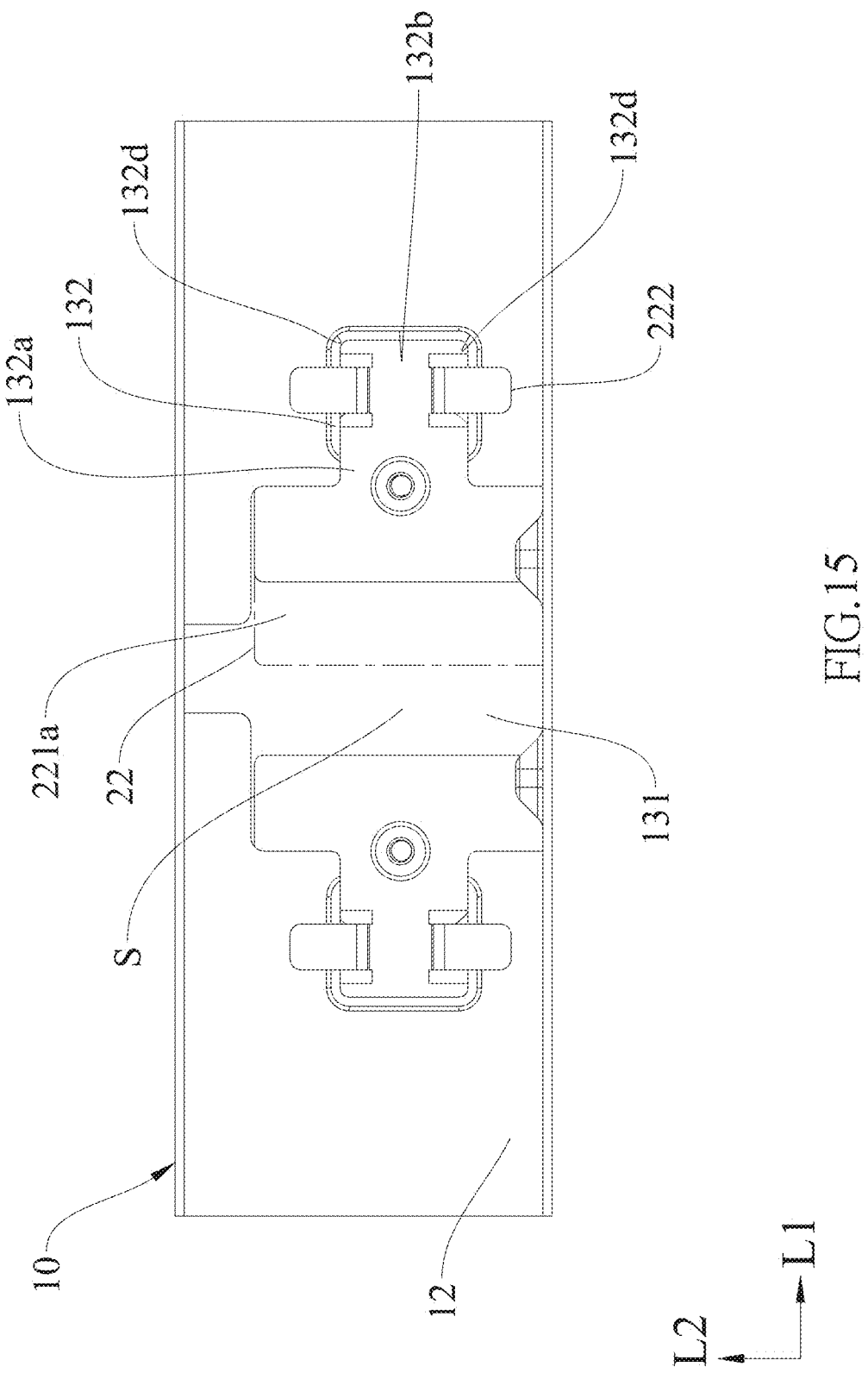
FIG. 15 is a schematic view of the positioning assembly in FIG. 11 installed on the main plate.
Figure 16:
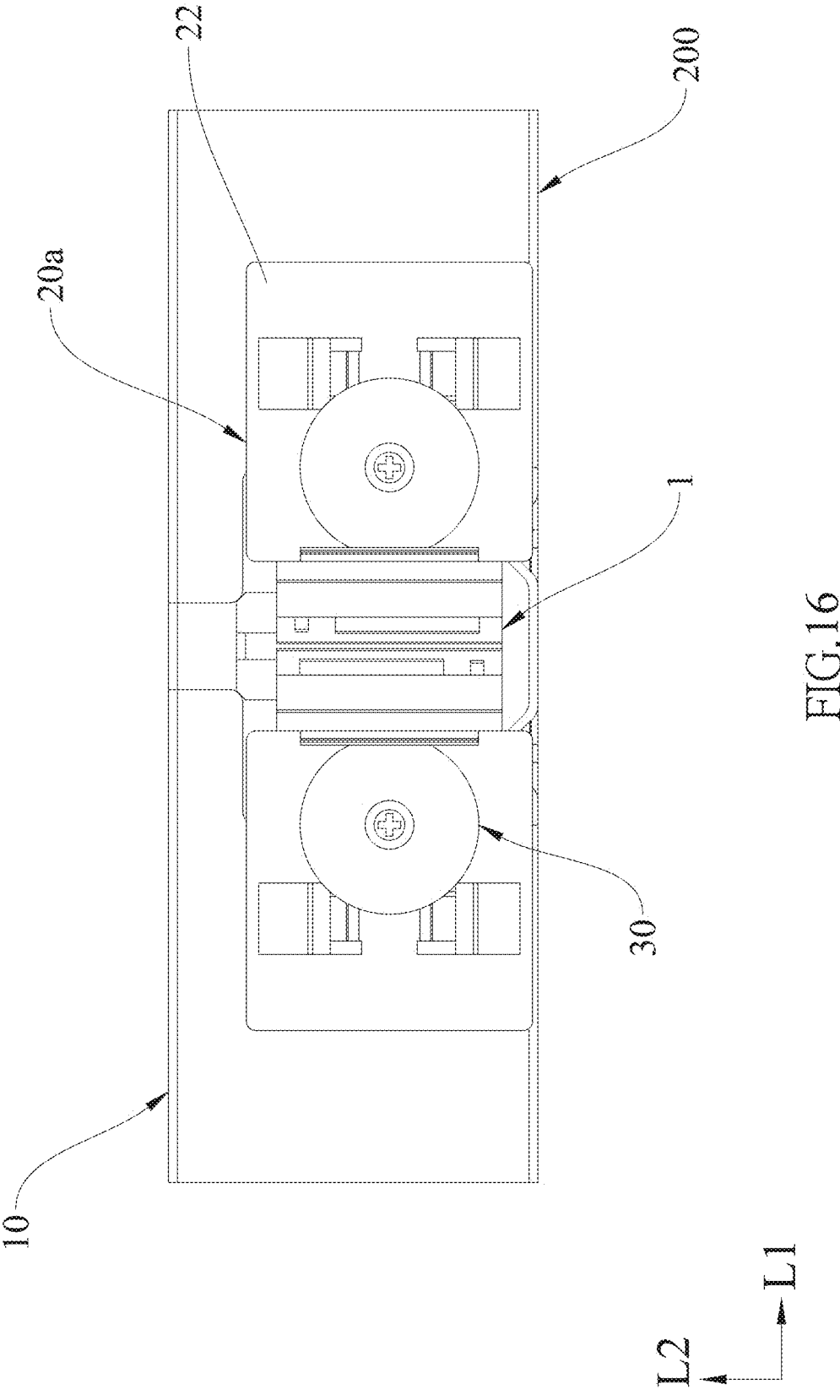
FIG. 16 is a front view of the fixing device in FIG. 11.
Figure 17:
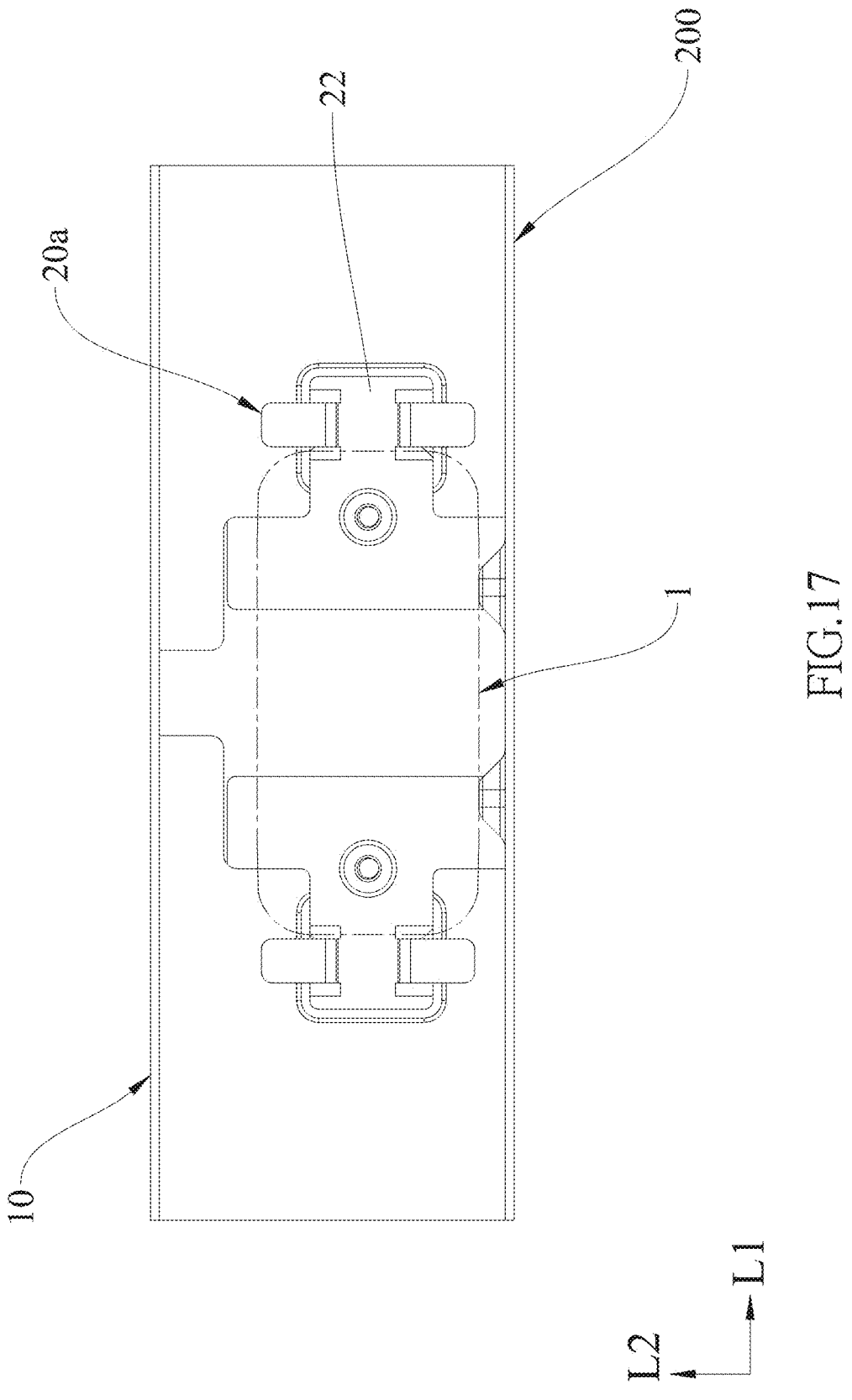
FIG. 17 is a rear view of the fixing device in FIG. 11.

Referring to FIG. 15 to FIG. 17, in operation, the two positioning plates 22 of the positioning assembly 20a are respectively moved from the corresponding main section 131 of the slot 13 to the side sections 132 along the horizontal axis L1, so that each of the tongues 222 is moved from the main section 131 to pass through the open end 132a of each of the side sections 132 and is moved toward the closed end 132b of each of the side sections 132 along the horizontal axis L1 until the fitting portions 224 of each of the positioning plates 22 are fitted to the positioning edge portions 132c' of each of the side sections 132 along the vertical axis L2. Then, the power connector 1 is moved toward the inner surface 12 of the main plate 10 along the reference axis L3, so that the main body 1a of the power connector 1 passes through the main section 131 and the space S between the two first sections 221a and protrudes out of the outer surface 11 of the main plate 10 along the reference axis L3. The two fixing members 30 are respectively screwed with two first through holes 223 of the positioning assembly 20a and two engaging holes 1b1 of the power connector 1 in sequence along the reference axis L3. In this way, a size of the slot 13 could be restricted to meet the specification of the power connector 1 through the positioning assembly 20a.

Figure 18:
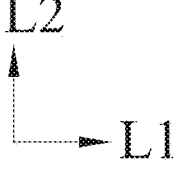
FIG. 18 is a schematic view of the positioning assembly installed on the fixing device according to a third embodiment of the present disclosure.

A fixing device 300 according to a third embodiment of the present disclosure is illustrated in FIG. 18 and is based on the first embodiment. A positioning assembly 20b of the third embodiment further includes a bridging structure 23. The bridging structure 23 includes a first bridging member 231 and a second bridging member 232. The first bridging member 231 and the second bridging member 232 face each other in the vertical axis L2 and are connected to the plate bodies 211 of the two positioning plates 21. Two ends of the first bridging member 231 are respectively connected to a top side of the two first sections 211a of the plate bodies 211. Two ends of the second bridging member 232 are respectively connected to a bottom side of the two first sections 211a of the plate bodies 211. In the third embodiment, the first bridging member 231 and the second bridging member 232 form an elastic structure to be compressible to move the two positioning plates 21 toward each other along the horizontal axis L1.

In operation, the two positioning plates 21 are simultaneously compressed along the horizontal axis L1, so that the first bridging member 231 and the second bridging member 232 generate an elastic force. After the positioning assembly 20b is moved to the slot 13 by the elastic force, the two positioning plates 21 are released, so that the elastic force of the first bridging member 231 and the second bridging member 232 is released to move the two positioning plates 21 away from each other along the horizontal axis L1. At the same time, the two tongues 222 are moved from the main section 131 to pass through the open end 132a of the two side sections 132 and are moved toward the closed end 132b of the side sections 132 along the horizontal axis L1 until the fitting portion 214 of each of the positioning plates 21 fits around each of the positioning edge portions 132c along the horizontal axis L1. Then, the power connector 1 is moved toward the inner surface 12 of the main plate 10 along the reference axis L3, so that the main body 1a of the power connector 1 passes through the main section 131 and the space S between the two first sections 211a along the reference axis L3 and protrudes out of the outer surface 11 of the main plate 10. The two fixing members 30 are respectively screwed with the first through holes 213 of the positioning assembly 20b and the two engaging holes 1b1 of the power connector 1 in sequence along the reference axis L3. In this way, a size of the slot 13 could be restricted by the positioning assembly 20b to meet the specification of the power connector 1.

The bridging structure 23 of the third embodiment could be used in the positioning assembly 20a of the second embodiment.

With the aforementioned design, the positioning plates of the positioning assembly restrict the size of the slot of the main plate, so that the fixing device of the present disclosure could allow the power connector to be installed on the main plate. With the structure changes of the positioning assembly, the fitting portions of the tongues are fitted to the positioning edge portions of the main plate, so that the space formed between the two first sections restricts the size of the slot in the horizontal axis for the power connector with a smaller size to pass through the space.

Moreover, when another power connector with a larger size is about to be installed, the positioning assembly could be omitted and the main body of the another power connector could pass through the main section along the reference axis, and the two fixing members pass through the two side sections along the reference axis to be screwed into the two engaging holes of the another power connector, so that the slot of the main plate is applicable to two power connectors with two different sizes. In this way, the development cost of the main plate could be reduced.

It must be pointed out that the embodiments described above are only some preferred embodiments of the present disclosure. All equivalent structures which employ the concepts disclosed in this specification and the appended claims should fall within the scope of the present disclosure.

What is claimed is:

1. A fixing device, adapted to connect to a power connector, wherein the power connector has a main body and two ear portions; the two ear portions are respectively located on two opposite sides of the main body and respectively has an engaging hole; the fixing device comprising:

a main plate having a slot, wherein the slot is adapted to be inserted by the power connector; the slot comprises a main section and two side sections; the two side sections are respectively located on two opposite sides of the main section; a periphery of each of the two side sections has at least one positioning edge portion;

a positioning assembly comprising two positioning plates, wherein each of the two positioning plates comprises a plate body and at least one tongue; the at least one tongue is connected to the plate body; at least one fitting portion is formed between the at least one tongue and the plate body; the at least one tongue of each of the two positioning plates corresponds to each of the two side sections of the slot; the at least one fitting portion of each of the two positioning plates fits around the at least one positioning edge portion of the periphery of each of the two side sections; the main body of the power connector passes between the two plate bodies of the two positioning plates; each of the two plate bodies has a first through hole; the two first through holes of the two plate bodies respectively correspond to the two engaging holes of the two ear portions of the power connector; and two fixing members respectively passing through the two first through holes of the two plate bodies to engage with the two engaging holes of the two ear portions of the power connector.

2. The fixing device as claimed in claim 1, wherein each of the two plate bodies of each of the two positioning plates has a first section and a second section; the first through hole is located on the first section; a space is formed between the two first sections of the two plate bodies of the two positioning plates for the main body of the power connector to pass through; the at least one tongue of each of the two positioning plates is connected to the second section of each of the two positioning plates.

3. The fixing device as claimed in claim 2, wherein each of the two side sections of the main plate has an open end and a closed end; the open end communicates with the main section; a periphery of the closed end forms the at least one positioning edge portion; the at least one positioning edge portion of one of the two side sections and the at least one positioning edge portion of the other side section face each other in a horizontal axis; the at least one fitting portion of one of the two positioning plates and the at least one fitting portion of the other positioning plate face back to back in the horizontal axis; the at least one fitting portion of each of the two positioning plates fits around the at least one positioning edge portion of the periphery of the closed end of each of the two side sections along the horizontal axis.

4. The fixing device as claimed in claim 2, wherein each of the two side sections of the main plate has an open end, a closed end, and two connected walls; the open end communicates with the main section; the two connected walls face each other in a vertical axis and are connected between the open end and the closed end; the at least one positioning edge portion of each of the two positioning plates comprises two positioning edge portions and the two positioning edge portions are respectively formed on a periphery of the two connected walls in the vertical axis; the at least one tongue of each of the two positioning plates comprises two tongues; the two tongues of each of the two positioning plates face back to back in the vertical axis and are connected to the second section of each of the two positioning plates; the at least one fitting portion of each of the two positioning plates comprises two fitting portions and the two fitting portions are formed between the corresponding second section and the two tongues.

5. The fixing device as claimed in claim 4, wherein the two fitting portions of each of the two positioning plates are fitted to the two positioning edge portions of the two connected walls of each of the two side sections along a horizontal axis.

6. The fixing device as claimed in claim 2, wherein the second section of the plate body of each of the two positioning plates has at least one second through hole; the at least one tongue of each of the two positioning plates is connected to a hole edge of the at least one second through hole of each of the two positioning plates.

7. The fixing device as claimed in claim 1, wherein each of the two fixing members comprises a bolt and a gasket; the bolt comprises a head portion and a body portion; the body portion passes through the gasket; the gasket is located between the head portion and the plate body of one of the two positioning plates that is corresponding.

8. The fixing device as claimed in claim 1, wherein the positioning assembly comprises a bridging structure; the bridging structure is connected to the two plate bodies of the two positioning plates.

9. The fixing device as claimed in claim 8, wherein the bridging structure comprises a first bridging member and a second bridging member; the first bridging member and the second bridging member face each other in a vertical axis; two ends of the first bridging member are respectively connected to the two first sections of the two plate bodies; two ends of the second bridging member are respectively connected to the two first sections of the two plate bodies; the first bridging member and the second bridging member are compressible to move the two positioning plates toward each other.

10. The fixing device as claimed in claim 1, wherein each of the two side sections of the main plate has an open end, a closed end, and two connected walls; the open end communicates with the main section; the two connected walls face each other in a vertical axis and are connected between the open end and the closed end; the two closed ends of the two side sections face each other in a horizontal axis; the slot comprises a notch located on a side of the main section in the vertical axis and communicates with the main section; a height of the main section in the vertical axis ranges between 31.8 mm and 32.2 mm; a width of the main section in the horizontal axis ranges between 39.8 mm and 40.2 mm; a height of each of the two side sections in the vertical axis ranges between 12.9 mm and 14.1 mm; a distance between the two closed end of the two side section in the horizontal axis ranges between 71.7 mm and 72.3 mm.

* * * * *